United States Patent [19]
Molloy

[11] Patent Number: 5,052,031
[45] Date of Patent: Sep. 24, 1991

[54] PHASE LOCKED LOOP INCLUDING NON-INTEGER MULTIPLE FREQUENCY REFERENCE SIGNAL

[75] Inventor: Nicholas J. Molloy, Haverhill, Mass.

[73] Assignee: AT&T Bell Laboratories, Murray Hill, N.J.

[21] Appl. No.: 567,490

[22] Filed: Aug. 14, 1990

[51] Int. Cl.$^5$ .............................................. H03L 7/06
[52] U.S. Cl. ..................................... 375/120; 328/16; 328/55; 331/1 A; 331/25
[58] Field of Search .................. 375/81, 97, 119, 120; 331/1 A, 18, 25, 51, 76; 307/511, 514, 516, 526, 529; 328/16, 25, 30, 55

[56] References Cited

U.S. PATENT DOCUMENTS

| | | | |
|---|---|---|---|
| 3,936,762 | 2/1976 | Cox, Jr. et al. | 375/120 |
| 3,943,460 | 3/1976 | Arai | 331/51 |
| 4,030,045 | 6/1977 | Clark | 375/120 |
| 4,363,002 | 12/1982 | Fuller | 331/1 A |
| 4,538,119 | 8/1985 | Ashida | 331/18 |
| 4,847,875 | 7/1989 | Choi | 375/112 |
| 4,903,283 | 2/1990 | Eisenberg | 328/55 |

OTHER PUBLICATIONS

*Digital PLL Frequency Synthesizers, Theory and Design*, Ulrich L. Rohde, Ph.D., Sc.D., 1983 Prentice-Hall, Inc., pp. 124–125.
*High Speed CMOS Data Manual*, Signetics, ©1988, pp. 7-444-7.446, 7-448-7-451, 7-983-7-985.

Primary Examiner—Benedict V. Safourek
Attorney, Agent, or Firm—Thomas Stafford

[57] ABSTRACT

A digital phase locked loop is employed to realize an output clock signal from a reference signal having a frequency which is not an integer multiple of the output clock signal frequency. This is realized by employing a programmable divider for dividing the reference signal which is dynamically controlled by a controllably variable base divisor. The base divisor control is responsive to the reference signal and to a phase error signal. The base divisor is generated to obtain a desired fractional division of the reference signal frequency and in a manner to minimize the amplitude of any resulting "high" frequency jitter in the output clock signal from the loop.

16 Claims, 1 Drawing Sheet

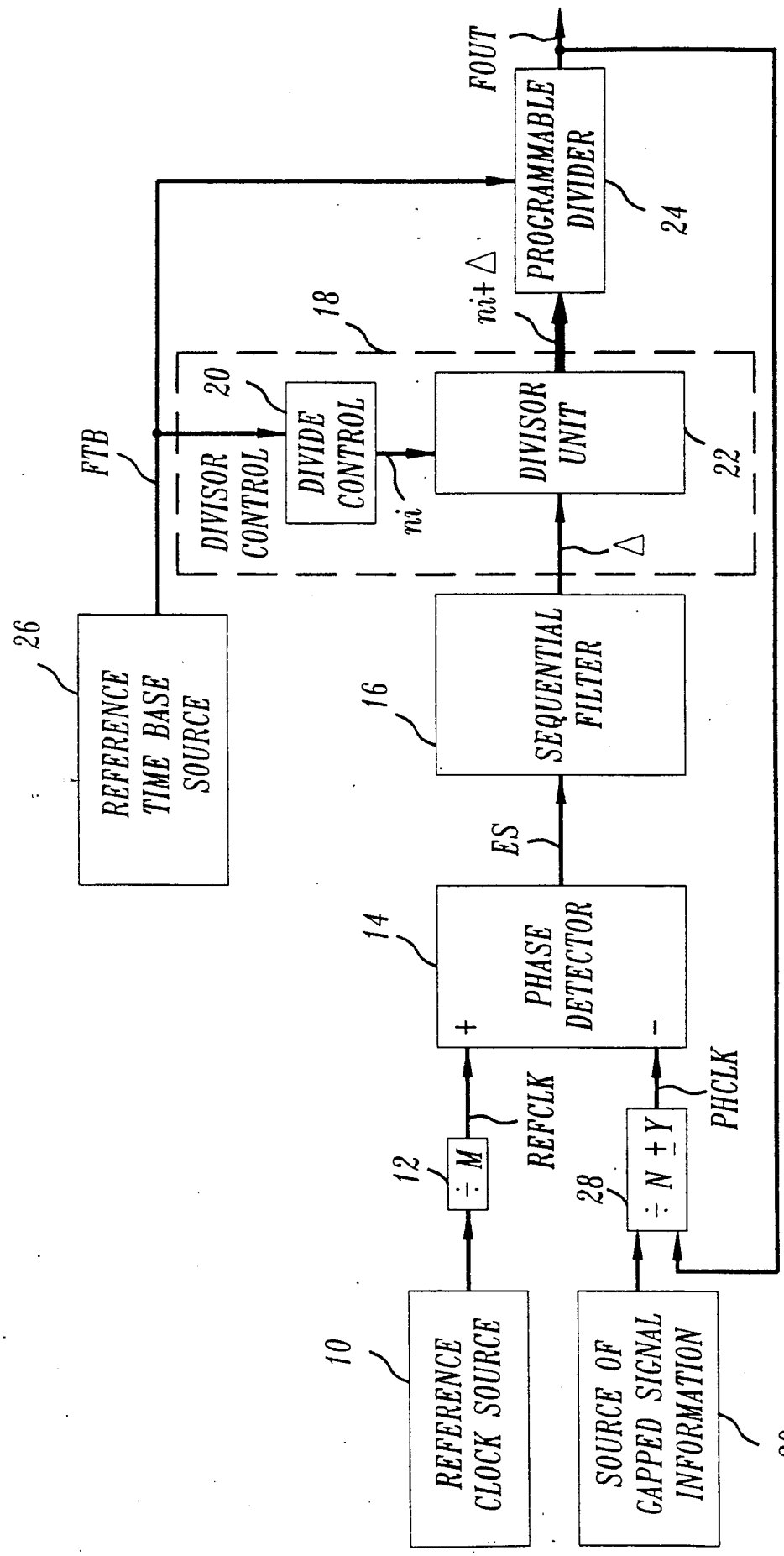

PHASE LOCKED LOOP INCLUDING NON-INTEGER MULTIPLE FREQUENCY REFERENCE SIGNAL

TECHNICAL FIELD

This invention relates to timing circuits for use in digital transmission systems and, more particularly, to timing circuits including a digital phase locked loop.

BACKGROUND OF THE INVENTION

It is well-known that local timing signals in a digital receiver must be synchronized to an incoming digital in order to recover the data. Heretofore, such timing signals were recovered from the incoming digital signal by employing a phase locked loop. The phase locked loop was responsive to the incoming digital signal for generating a phase error signal which, in turn, controls a voltage controlled oscillator to generate a local timing signal.

In frames of certain incoming digital signals, there are additional overhead bit positions and so-called stuffing bit positions which when eliminated leave gaps in the data stream. Because of such gaps, the recovered timing signal generated by a typical phase locked loop arrangement is not smooth causing jitter. As is well-known, jitter is extremely undesirable in timing signals. Additionally, it is desirable that the generated timing signal follow variations in the incoming digital signal caused by the stuffing bits. One arrangement, including compensation for jitter caused by such an incoming signal including gaps is disclosed in U.S. Pat. No. 4,847,875 issued to DooWhan Choi on Jul. 11, 1989. This prior arrangement, however, was limited to using either an analog phase locked loop or to a digital phase locked loop that has a reference time base source frequency which is an integer multiple of the frequency of the output signal from the phase locked loop.

In certain digital transmission systems the readily available "high" frequency reference signals are not necessarily integer multiples of the frequency of the phase locked loop output signal. A desired clock signal could possibly be obtained in such arrangements by employing a frequency synthesizer using fractional division of a reference signal. However, the resulting reference signal would have jitter that would be transferred to the output signal generated by the phase locked loop and the dynamic performance of the loop would not be acceptable or usable in practical applications.

SUMMARY OF THE INVENTION

The problems relating to jitter amplitude and dynamic performance in a digital phase locked loop for generating an output signal having a frequency not necessarily a submultiple of a reference signal frequency are overcome, in accordance with an aspect of the invention, by employing in the digital phase locked loop a programmable divider which is dynamically controlled by a controllably variable base divisor. The base divisor control is responsive to a reference signal having a frequency which is a non-integer multiple of the frequency of an output signal from the phase locked loop and to a control output from the phase locked loop phase detector.

More specifically, a variable base divisor is generated in response to the reference signal so that resulting high frequency jitter in the loop is at an acceptable amplitude. This variable base divisor is further modified in response to the phase detector control signal output to realize the phase locked loop function.

In a specific embodiment of the invention, the base divisor is controllably varied between at least two integer divisors to realize a a desired fractional division of the reference signal frequency. The sequence of occurrence of the at least two divisors is such that they are switched as often and in as uniform a manner as possible to minimize the high frequency jitter amplitude in the resulting clock signal.

BRIEF DESCRIPTION OF THE DRAWING

The invention will be more fully understood from the following detailed description of an illustrative embodiment taken in conjunction with the appended figure which shows in simplified block diagram form a digital phase locked loop incorporating an embodiment of the invention.

DETAILED DESCRIPTION

As indicated above, certain incoming digital signals may have large gaps in the data stream because of overhead bits and also because of stuffing bits. One such signal is the SONET VT1.5 signal which is described in a Technical Advisory entitled "SONET Transport Systems Common Generic Criteria", TA-TSY-000253, Bell Communications Research, Feb. 1989 and the ANSI draft Standard entitled "Digital Hierachy—Optical Interface Rates and Formats Specifications (SONET)", dated February 1990.

The figure depicts in simplified block diagram form a digital phase locked loop including an embodiment of the invention. Accordingly, shown is local reference clock source 10 which, in this example, is the VT1.5 rate of 1.728 MHz. Divider 12 is used to obtain a desired reference clock signal to be supplied to phase detector 14. In this example, predetermined divisor M of divider 12 is selected to be 216 so that the REFCLK is 8 KHz. REFCLK is supplied to one input of phase detector 14. A phase clock (PHCLK) signal derived from the phase locked loop output clock signal FOUT is supplied as a second input to phase detector 14. Phase detector 14 generates an error signal (ES) in known fashion which is proportional to the algebraic difference between REFCLK and PHCLK. Error signals ES is supplied from phase detector 14 via sequential filter 16 which yields a filtered version thereof, namely, $\Delta$. In turn, the $\Delta$ output from sequential filter 16 is supplied to divisor control 18 and, therein, to divisor unit 22. Signal $\Delta$, in this example is either +1,0 or −1, depending on which direction the frequency of FOUT must is adjusted. Output signal FOUT is the desired output clock signal being generated and is also feedback to controllable divider 28 which generates PHCLK. Second predetermined divisor N of controllable divider 28 is selected, in this example, to be 193 to obtain a REFCLK which is nominally 8 KHz. A signal is supplied to divider 28 from a source of gapped signal information 30. In this example, the gapped signal information is representative of the stuffing bit position content in the SONET VT 1.5 signal. Thus, PHCLK is compensated depending on the content of the stuffing bit positions in the incoming digital signal. For normal operation, divider 28 divides FOUT by a predetermined divisor having the nominal value N. In this example, the nominal frequency of FOUT is 1.544 MHz (corresponding to the DS1 digital rate) and N=193 to generate PHCLK=8 KHz. When the stuffing bit positions include non-data bits divider 16 divides FOUT by a divisor having a value N−Y, wherein in this example Y=1. This causes PHCLK to increase slightly which, in turn, causes error signal ES generated by phase detector 14 to decrease. The decrease in error signal ES causes a slight decrease in the bit rate of FOUT. When the stuffing bit positions include data bits divider 28 divides FOUT by a divisor having a value N+Y, where in this example Y=1. This causes PHCLK to decrease slightly which, in turn, causes error signal ES generated by phase detector 14 to increase. The increase in error signal ES causes a slight increase in the bit rate of FOUT. Thus, the frequency of PHCLK is adjusted to compensate for a decrease in data when the stuffing bit positions are non-data bits and to compensate for an increase in data when the stuffing bit positions are data bits. Consequently, variations are caused in the frequency of output signal FOUT which correspond to the variations in the actual data rate of the incoming digital signal.

The desired changes in frequency of FOUT in response to the normal phase differences in the phase locked loop are realized by supplying signal Δ from sequential filter 16, to divisor control 18 and, therein, to divisor unit 22. In this example, Δ is +1, −1 or 0. Also supplied to divisor unit 22 is divisor ni from divide control 20. Divide control 20 is employed, in this example, to generate at least two divisors in order to realize a fractional division of the reference time base signal FTB from reference time base source 26. As indicated above, the reference time base signal FTB frequency is not an integer multiple of the phase locked loop output clock signal FOUT frequency. The desired nominal frequency of phase locked loop output clock signal FOUT is obtained by switching ni between at least two divisors. In order to minimize the amplitude of any resulting "high" frequency jitter in the phase locked loop output clock signal, the switching of the divisors is done as often as possible and in as uniform a manner as possible. By way of example and not to be construed as limiting the scope of the invention, let us consider a specific example. Assume that the desired phase locked loop FOUT is the output signal DS1 clock signal of 1.544 MHz and the reference time base signal is the SONET STS-1 clock signal of 51.84 MHz.

Then, $$\frac{F_{STS-1}}{F_{DS1}} = \frac{51.84 \text{ MHz}}{1.544 \text{ MHz}} = \frac{6480}{193} = \frac{u(33) + v(34)}{u + v}$$

letting (u+v)=193,
then u=82 and v=111.

Thereafter, to realize the desired fractional divison of FTB to yield FOUT every (u+v) (193) time intervals divided by 33 v (82) time intervals and by 34 v (111) time intervals. The resulting average frequency of FOUT every (u+v) (193) time intervals is the desired nominal DS1 clock frequency of 1.544 MHz. To minimize the amplitude of any high frequency jitter in FOUT, divide control 20 effects the divisor control if ni by uniformly distributing the divisors over the interval comprising (u+v) (193) time intervals. In this specific example, this is realized by alternating between the two divisors, i.e., 33 and 34, in as uniform a manner as possible in order to minimize the amplitude of any resulting "high" frequency jitter in FOUT.

Specifically, starting on a divide by 34, alternate every time interval between dividing by 34 and dividing by 33. Every sixth time interval insert an extra divide by 34 and then proceed to alternate on the divisor before this insertion. On the 66th, 126th, and the 192nd time intervals do not insert an extra divide by 34; alternate normally. Repeat this algorithm every 193 time intervals. Table 1 illustrates the sequence generated by this algorithm.

TABLE 1

| Time Interval | Divide by |
|---|---|
| 1 | 34 |
| 2 | 33 |
| 3 | 34 |
| 4 | 33 |
| 5 | 34 |
| 6 | 34 |
| 7 | 33 |
| 8 | 34 |
| 9 | 33 |
| 10 | 34 |
| 11 | 33 |
| 12 | 34 |
| 13 | 34 |
| 14 | 33 |
| 15 | 34 |
| 16 | 33 |
| 17 | 34 |
| 18 | 34 |
| 19 | 33 |
| 20 | 34 |
| 21 | 33 |
| 22 | 34 |
| 23 | 33 |
| 24 | 34 |
| 25 | 34 |
| 26 | 33 |
| 27 | 34 |
| 28 | 33 |
| 29 | 34 |
| 30 | 34 |
| 31 | 33 |
| 32 | 34 |
| 33 | 33 |
| 34 | 34 |
| 35 | 33 |
| 36 | 34 |
| 37 | 34 |
| 38 | 33 |
| 39 | 34 |
| 40 | 33 |
| 41 | 34 |
| 42 | 34 |
| 43 | 33 |
| 44 | 34 |
| 45 | 33 |
| 46 | 34 |
| 47 | 33 |
| 48 | 34 |
| 49 | 34 |
| 50 | 33 |
| 51 | 34 |
| 52 | 33 |
| 53 | 34 |
| 54 | 34 |
| 55 | 33 |
| 56 | 34 |
| 57 | 33 |
| 58 | 34 |
| 59 | 33 |
| 60 | 34 |
| 61 | 34 |
| 62 | 33 |
| 63 | 34 |
| 64 | 33 |
| 65 | 34 |
| 66 | 33 |
| 67 | 34 |
| 68 | 33 |
| 69 | 34 |
| 70 | 33 |
| 71 | 34 |

TABLE 1-continued

| Time Interval | Divide by |
|---|---|
| 72 | 34 |
| 73 | 33 |
| 74 | 34 |
| 75 | 33 |
| 76 | 34 |
| 77 | 33 |
| 78 | 34 |
| 79 | 34 |
| 80 | 33 |
| 81 | 34 |
| 82 | 33 |
| 83 | 34 |
| 84 | 34 |
| 85 | 33 |
| 86 | 34 |
| 87 | 33 |
| 88 | 34 |
| 89 | 33 |
| 90 | 34 |
| 91 | 34 |
| 92 | 33 |
| 93 | 34 |
| 94 | 33 |
| 95 | 34 |
| 96 | 34 |
| 97 | 33 |
| 98 | 34 |
| 99 | 33 |
| 100 | 34 |
| 101 | 33 |
| 102 | 34 |
| 103 | 34 |
| 104 | 33 |
| 105 | 34 |
| 106 | 33 |
| 107 | 34 |
| 108 | 34 |
| 109 | 33 |
| 110 | 34 |
| 111 | 33 |
| 112 | 34 |
| 113 | 33 |
| 114 | 34 |
| 115 | 34 |
| 116 | 33 |
| 117 | 34 |
| 118 | 33 |
| 119 | 34 |
| 120 | 34 |
| 121 | 33 |
| 122 | 34 |
| 123 | 33 |
| 124 | 34 |
| 125 | 33 |
| 126 | 34 |
| 127 | 33 |
| 128 | 34 |
| 129 | 33 |
| 130 | 34 |
| 131 | 33 |
| 132 | 34 |
| 133 | 34 |
| 134 | 33 |
| 135 | 34 |
| 136 | 33 |
| 137 | 34 |
| 138 | 34 |
| 139 | 33 |
| 140 | 34 |
| 141 | 33 |
| 142 | 34 |
| 143 | 33 |
| 144 | 34 |
| 145 | 34 |
| 146 | 33 |
| 147 | 34 |
| 148 | 33 |
| 149 | 34 |
| 150 | 34 |
| 151 | 33 |
| 152 | 34 |
| 153 | 33 |
| 154 | 34 |
| 155 | 33 |
| 156 | 34 |
| 157 | 34 |
| 158 | 33 |
| 159 | 34 |
| 160 | 33 |
| 161 | 34 |
| 162 | 34 |
| 163 | 33 |
| 164 | 34 |
| 165 | 33 |
| 166 | 34 |
| 167 | 33 |
| 168 | 34 |
| 169 | 34 |
| 170 | 33 |
| 171 | 34 |
| 172 | 33 |
| 173 | 34 |
| 174 | 34 |
| 175 | 33 |
| 176 | 34 |
| 177 | 33 |
| 178 | 34 |
| 179 | 33 |
| 180 | 34 |
| 181 | 34 |
| 182 | 33 |
| 183 | 34 |
| 184 | 33 |
| 185 | 34 |
| 186 | 34 |
| 187 | 33 |
| 188 | 34 |
| 189 | 33 |
| 190 | 34 |
| 191 | 33 |
| 192 | 34 |
| 193 | 33 |

The divisor ni is supplied from divide control 20 to divisor unit 22 in the sequence shown in TABLE I. Divisor ni is controllably adjusted in response to $\Delta$ from sequential filter 16 to yield ni+$\Delta$ which is then the divisor control signal supplied to control programmable divider 24 to divide FTB for realizing the desired FOUT clock signal. Again, in this example, FTB is the SONET STS-1 clock signal of 51.84 MHz and FOUT is the DS1 clock signal 1.544 MHz.

It is noted that the STS1 clock signal is a very stable signal and readily available in many SONET related applications. However, any other reference time base signal source for generating a reference signal having desired stability attributes may be utilized.

It is noted that the compensation to PHCLK is on a frame-by-frame basis of the incoming signal.

The invention has been described in the context of eliminating jitter caused by large gaps in an incoming digital signal resulting from overhead bit removal. It will be apparent to those skilled in the art that the invention is equally applicable for use with any incoming digital signal having large gaps whether or not they are caused by overhead bit removal or stuffing bits. For example, there may just be excess data bit positions that are not being used. Additionally, the embodiment of the invention has been described in terms of the DS1 digital rate. It will also be apparent to those skilled in the art that the invention is applicable for obtaining a timing signal to correspond to an incoming digital signal having any one of a number of digital rates.

I claim:

1. A digital phase locked loop for generating an output clock signal having a prescribed frequency comprising:
   a source of a first reference clock signal;
   means supplied with said output clock signal for generating a phase clock signal;
   phase detector means responsive to said first reference clock signal and said phase clock signal for generating an error signal;
   means supplied with said error signal for generating a control signal representative of a filtered version of said error signal;
   a source of a reference signal having a frequency which is a non-integer multiple of said output clock signal frequency;
   programmable divider means responsive to a divisor control signal for dividing said reference signal to obtain said output clock signal having said prescribed frequency; and
   means supplied with said reference signal and said contol signal for generating said divisor control signal.

2. A digital phase locked loop as defined in claim 1 wherein said means for generating said divisor control signal includes means for controllably dividing said reference signal to obtain a divisor signal and means for combining said divisor signal and said control signal to obtain said divisor control signal.

3. A digital phase locked loop as defined in claim 2 wherein said means for controllably dividing includes means for generating a prescribed sequence of divisor signals so that any resulting jitter is at a high frequency of acceptable amplitude in said output clock signal.

4. A digital phase locked loop as defined in claim 3 wherein said means for generating a prescribed sequence of divisor signals generates at least two divisor signals which alternate in said sequence in a predetermined manner.

5. A digital phase locked loop as defined in claim 4 wherein said means for generating said sequence of at least two divisor signals alternates said at least two divisor signals in a predetermined uniform manner so that said output clock frequency is obtained.

6. A digital phase locked loop as defined in claim 5 wherein said means for generating said phase clock signal includes a source of gapped signal information and controllable divider means supplied with said output clock signal and being responsive to said gapped signal information for controllably adjusting said phase clock signal rate.

7. A digital phase locked loop as defined in claim 6 wherein said source of a first reference clock signal includes a source of a reference clock signal in synchronization with a gapped incoming signal and divider means for dividing said reference clock signal to obtain said first reference clock signal.

8. A digital phase locked loop as defined in claim 7 wherein said at least two divisors include a first divisor of 33 and at least a second divisor of 34.

9. A digital phase locked loop as defined in claim 8 wherein said nominal frequency includes 193 time intervals and wherein said sequence of said first divisor and said at least second comprises starting with said at least second divisor alternate every time interval between said at least second divisor and said at least first divisor, every sixth time interval said-at least second divisor is repeated except in time intervals 66, 126 and 192 alternate said divisors.

10. A digital phase locked loop as defined in claim 9 wherein said reference signal has a frequency of 51.84 MHz, said output clock signal has a nominal frequency of 1.544 MHz and said reference clock signal has a frequency of 1.728 MHz.

11. A digital phase locked loop as defined in claim 2 wherein said means for controllably dividing includes means for obtaining a prescribed fractional division of said reference signal.

12. A digital phase locked loop as defined in claim 11 wherein said means for obtaining a prescribed fractional division includes means for generating at least two divisors which alternate in a prescribed sequence at a rate in prescribed relationship to a nominal frequency of said output clock signal.

13. A digital phase locked loop as defined in claim 12 wherein said means for generating said at least two divisors alternates them as often as possible and in as uniform a manner as possible so that any resulting jitter is at a high frequency of acceptable amplitude in said output clock signal.

14. A digital phase locked loop as defined in claim 13 wherein said at least two divisors include a first divisor of 33 and at least a second divisor of 34.

15. A digital phase locked loop as defined in claim 14 wherein said nominal frequency includes 193 time intervals and wherein said sequence of said first divisor and said at least second comprises starting with said at least second divisor alternate every time interval between said at least second divisor and said at least first divisor, every sixth time interval said at least second is divisor repeated except in time intervals 66, 126 and 192 alternate said divisors.

16. A digital phase locked loop as defined in claim 15 wherein said reference signal has a frequency of 51.84 MHz, said output clock signal has a nominal frequency of 1.544 MHz and said reference clock signal has a frequency of 1.728 MHz.

* * * * *